United States Patent [19]

Hamadani

[11] Patent Number: 6,134,628
[45] Date of Patent: Oct. 17, 2000

[54] METHOD AND COMPUTER-BASED SYSTEM FOR REWRITING A NONVOLATILE REWRITABLE MEMORY

[75] Inventor: Yahya Hamadani, Sunnyvale, Calif.

[73] Assignee: Ricoh Company, Ltd., Tokyo, Japan

[21] Appl. No.: 09/016,734

[22] Filed: Jan. 30, 1998

[51] Int. Cl.[7] .................................................. G06F 12/00
[52] U.S. Cl. .............................. 711/103; 711/102; 380/4
[58] Field of Search .................................... 711/103, 102

[56] References Cited

U.S. PATENT DOCUMENTS

| | | | |
|---|---|---|---|
| 4,498,151 | 2/1985 | Henry ........................................ | 711/103 |
| 5,333,300 | 7/1994 | Fandrich ................................... | 711/103 |
| 5,390,317 | 2/1995 | Wesis et al. ............................. | 711/103 |
| 5,432,927 | 7/1995 | Grote et al. ............................. | 711/103 |
| 5,448,712 | 9/1995 | Kynett et al. ........................... | 711/103 |
| 5,513,333 | 4/1996 | Kynett et al. ........................... | 711/103 |
| 5,937,063 | 8/1999 | Davis ........................................ | 380/4 |

*Primary Examiner*—John W. Cabeca
*Assistant Examiner*—Jan Williams
*Attorney, Agent, or Firm*—Oblon, Spivak, McClelland, Maier & Neustadt, P.C.

[57] ABSTRACT

A method and system have a feature of rewriting an application program to a nonvolatile rewritable memory in a way that allows for prevention of execution or corrupted program or recovery from failures that occur during execution of the application program. Before writing the application program to a first segment of the memory, an indicator is written to a second segment of the memory, indicating that the first segment of memory contains "invalid" information. At least the first segment, but not the second segment, is then erased and the application program is then written to the first segment. If the writing process is not completed, perhaps due to an unforseen disturbance (e.g., power outage) in the system, the first segment retains the indicator without changing the indicator's value. However, if the writing process is completed, a control processor determines that the writing process is completed and changes the indicator in the first segment to a value indicative of "valid" data. Prior to subsequent attempts to execute the application program, the value is checked, and if the value indicates the presence of invalid data, process control does not transition to the application program. A delay provision is also included for providing a window of opportunity to issue a command signal during a predetermined time interval that causes the process flow to not transition to the application program, even if the indicator indicates the application program contains valid data.

9 Claims, 5 Drawing Sheets

METHOD AND COMPUTER-BASED SYSTEM FOR REWRITING A NONVOLATILE REWRITABLE MEMORY

CROSS-REFERENCE TO RELATED APPLICATION

This document contains subject matter related to that disclosed in co-pending U.S. patent application entitled "Multifunction Interface Card for Interfacing a Facsimile Machine Secure Modem, and a Personal Computer", filed on Dec. 8, 1997, Yahya Hamadani et al, identified by Ser. No. 08/987,139, the entire contents of which is incorporated herein by reference.

BACKGROUND OF THE INVENTION

Field of the Invention

The present invention relates to methods and computer-based systems that store programs in nonvolatile rewritable memory, and more particularly to storing the programs in segments of the nonvolatile rewritable memory.

Discussion of the Background

Commercially available digital interface devices provide an interface between a facsimile machine and a secure telephone unit using standard interface equipment and standard protocols such as RS-232. A facsimile machine having an RS-232 interface to a personal computer is also commercially available. Although Personal Computer Memory Card International Association (PCMCIA) cards provide interfaces between computer and modems, a PCMCIA interface between a laptop computer and a secure telephone unit is not commonly available, if available at all. The inventor also identified that there are no reconfigurable PCMCIA interfaces that permit convenient reprogramming of the PCMCIA card and allow for graceful recovery when an application program, written to a memory embedded (i.e., inaccessible to a user) in the PCMCIA card, fails to operate properly.

Protocol conversion PCMCIA cards typically include a memory that is embedded therein for storing a program that executes the desired protocol conversion operation. The embedded nature of this memory is the source of annoyances to end-users and developers alike, particularly if the memory is not a flash-memory and cannot be erased unless removed from the PCMCIA card. Similarly, hardware and software developers find that changing the application software contained in the embedded memory is difficult to reconfigure because it is difficult to assert control over the code stored in the memory.

In a development environment, the system may hang-up if the application software stored in the PCMCIA memory is incomplete or defective. To reset the system, and thus overcome the hang-up condition, power to the PCMCIA card is removed and reapplied. If the software stored in nonvolatile memory is defective, reapplying power to the PCMCIA card may not solve the problem. For example, if the software is defective and in someway inhibits a user from exerting control (by dispatching override commands, for example) over the process flow, the application software will perpetually cause the PCMCIA card to hang-up. Moreover, after a power-up event, the system will execute a boot program and then automatically transfer the process flow to the application program, and an error present in the application program causes the system to hang-up. Once the card is hung-up, the user is forced to remove the PCMCIA card from the computer and attempt to reconfigure the memory embedded therein, which is cumbersome, particularly if the memory is not flash memory. Consequently, some developers find it more cost effective to simply discard the entire PCMCIA card rather than attempt to reconfigure the memory therein.

SUMMARY OF THE INVENTION

Accordingly, one object of this invention is to provide a novel method and system for rewriting a nonvolatile memory that overcomes the above-mentioned limitations of existing methods and systems.

This and other objects of the present invention are achieved with a computer-based system and method that rewrites a nonvolatile rewritable memory in a way that is convenient for a system operator, prevents system hang-ups due to errors caused during a programming operation, and allows for recovery from failures that occur during execution of an embedded software application. In the system and method, the system operator identifies a new application that is to be stored in one, or more, of several segments of the nonvolatile memory, such as a Flash memory. Before writing the new application to a first segment of the memory, an indicator is written to a second segment of the memory, indicating that the first segment of memory contains "invalid" information. At least the first segment, but not the second segment, is then erased and the new application is then written to the first segment. If the writing process is interrupted, perhaps due to an unforseen disturbance (e.g., power outage) in the system, the first segment retains the indicator without changing the indicator's value. However, if the writing process is completed, a computer based process determines that the writing process is completed and changes the indicator's value in the first segment to a value indicative of "valid" data.

When using the memory after performing the programming process, a boot program (or kernel), stored on a third segment of the memory, is executed by the control processor. The boot program checks the indicator value stored in first segment and executes, after a predetermined delay, as will be discussed, the application program stored in the second segment if the indicator indicates the application program is "valid." On the other hand, if the boot program determines that the application program contains "invalid" data, the boot program will not execute the application program and will retain control of the process flow so that a system user may take corrective action, such as to reprogram the memory.

Regarding the delay feature of the present invention, if the boot process determines that the indicator value indicates the new application stored on the second segment is valid, the boot process will nonetheless wait a predetermined amount of time before executing the application. This delay period creates a window of opportunity for the system user to interrupt the process flow from making a transition from the boot program to the new application so that the system user may retain control over system and dispatch, if necessary, certain control instructions to modify the memory contents. Thus, this delay prevents a situation where the new application may have been correctly copied to the second segment, but the application program itself is incomplete or incorrect. Accordingly, by seizing control of the system, the boot process enables the system user to take corrective action, such as modifying the new application, and recover from application program induced problems.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
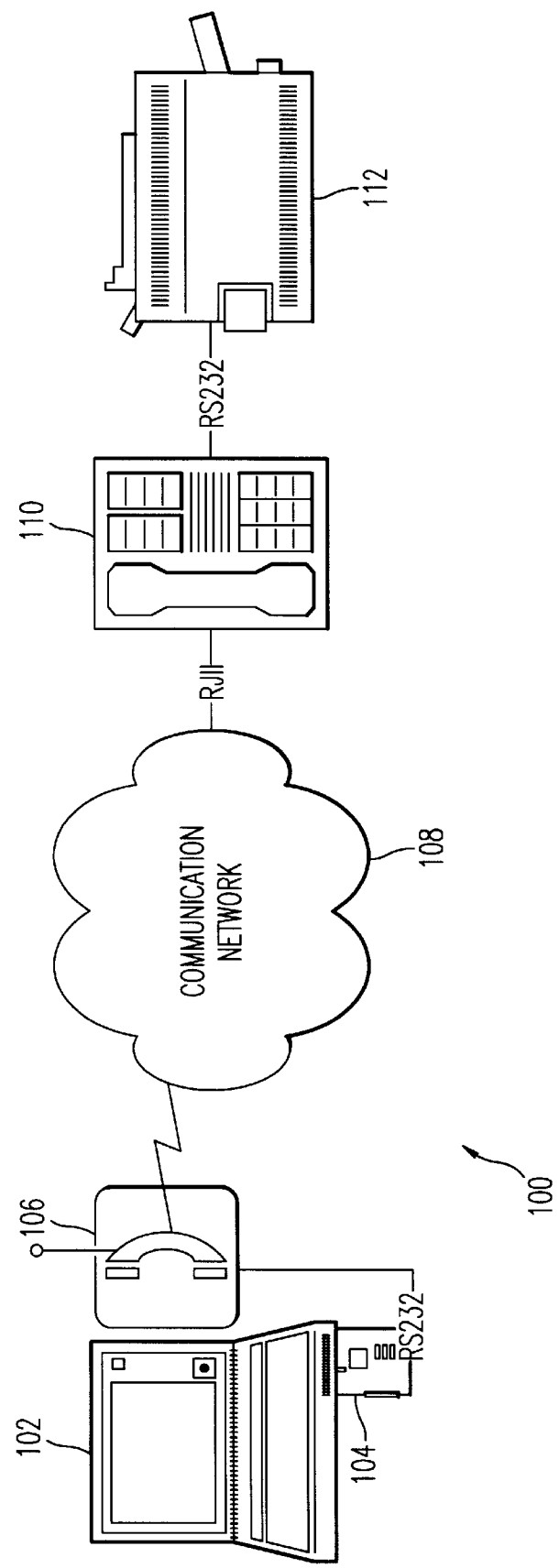
FIG. 1 is a block diagram illustrating a communication system in accordance with the present invention.

Referring now to the drawings wherein like reference numerals designate identical or corresponding parts throughout the several views and more particularly to FIG. 1 thereof, there is illustrated a block diagram of a communication system 100 in accordance with the present invention. The communication system 100 includes a laptop computer 102 with LCD display, a secure interface card 104, a telephone 106, a communication network 108, a secure telephone unit 110, and a secure facsimile machine 112. The computer 102 contains a processor that executes facsimile software, such as WINFAX software stored on the computer's memory; for converting computer data to a facsimile protocol, such as a G3 protocol, and vice versa. The computer 102 provides data in the facsimile format to the secure interface card 104 which then converts the data from the facsimile format into a secure protocol format. Alternatively, the secure interface card 104 responds to software commands from the computer 102 to implement a different protocol conversion process or simply route the data to the telephone 106. The computer 102 also provides commands to the secure interface card 104 for controlling the operation of the secure interface card 104. The commands may be, for example, to reprogram the nonvolatile memory contained in the secure interface card 104.

The secure interface card 104 is housed in a PCMCIA card format, although alternatively the interface card may be configured as a circuit board that is connected, by way of a bus, to the computer's processor. The computer 102 may be, for example, a conventional laptop computer such as a NEC VERSA 2000C (PC compatible) laptop or APPLE POWERBOOK computer.

The telephone unit 106 is configured to operate in one of several communications modes (i.e., "clear operation" where no encryption is performed, and various levels of "covered" communication where the telephone encrypts the data). The telephone unit 106 may be, for example, a CIPHERTAC telephone manufactured by Motorola, but similar secure telephone units (e.g., STU III) may be used as well. The telephone unit 106 then sends the encrypted data (or alternatively not encrypted if neither the interface card 104 or the telephone unit 106 are configured to encrypt the data) to a receiving telephone unit 110 by way of a communication network 108. The communication network 108 may be, for example, a cellular network, a public switched telephone network (PSTN), or a combination of both.

The secure telephone unit 110 (e.g., Model 4100 available from AT&T) decrypts the encrypted data received from the communication network 108, converts the decrypted data into a facsimile format (e.g., a G3 or G4 format), and then provides the de-encrypted data to the secure facsimile machine 112. The secure facsimile machine 112 converts the de-encrypted data to image data suitable for printing. An example of the secure facsimile machine 112 is model SFX 3700M manufactured by Ricoh Corporation.

Figure 2:
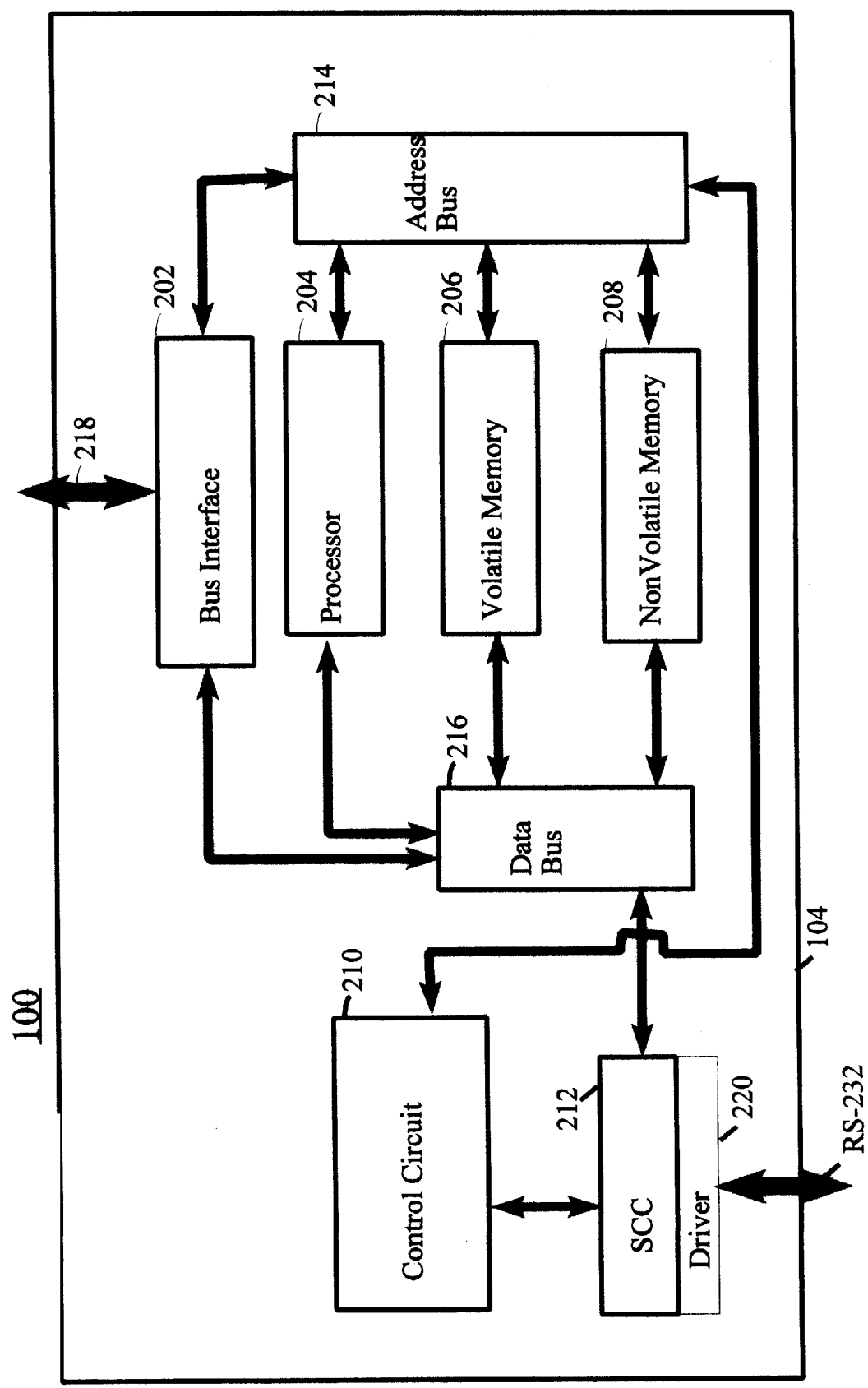
FIG. 2 is a block diagram illustrating a secure interface card of the communication system of FIG. 1.

FIG. 2 is a block diagram of the secure interface card 104. The secure interface card 104 includes a bus interface 202, a processor 204, a volatile memory 206, a nonvolatile memory 208, a control circuit 210, a Serial Communication Controller (SCC) 212, an address bus 214, and a data bus 216. The bus interface 202 communicates with the computer 102 via a bus 218, which in the present embodiment is a PCMCIA bus. However other buses may be used as well such as universal serial bus (USB), EIA-232, ISDN (ISO 8877), VMEbus, and IEEE 1394 ("FireWire") as described in Wickelgren, I., "The Facts About "FireWire", IEEE Spectrum, April 1997, Vol. 34, Number 4, pp. 19–25, the contents of which are incorporated herein by reference. The bus interface 202 controls the timing of retrieving data from the bus 218, and also provides the timing signals, such as clock signals, for the secure interface card 104. In one embodiment of the present invention, the bus interface 202 is a universal asynchronous receiver transmitter (UART), such as model number TL16PC564A manufactured by Texas Instruments. The computer 102 provides power to the secure interface card 104 via the bus interface 202. Alternatively, the secure interface card 104 may be powered by another source.

The address bus 214 is coupled to the bus interface 202, the processor 204, the volatile memory 206 and the nonvolatile memory 208 for communicating addresses there between. The control circuit 210 is also coupled to the address bus 214 for communicating control signals that administer internal and external data moves. Any processor suitable for embedded control may be used, such as model SN80C188XL20 manufactured by Intel Corporation of Santa Clara, Calif. The processor 204 is capable of executing any number of different software programs stored in memories 206, 208 or loaded into the processor 204 from an external source. The bus interface 202 converts data from the bus 218 into the protocol of the address bus 214 and the data bus 216.

The data bus 216 interconnects the processor 204, the bus interface 202, the volatile memory 206, the nonvolatile memory 208, and the control circuit 210. The SCC 212 also is coupled to the data bus 216 and communicates with the telephone 106 (FIG. 1) by way of an RS-232 port (or other interface such as those described above, e.g., USB, FireWire, etc.). The SCC 212 includes, for example, a model number AM85233-16 see, manufactured by Advanced Micro Devices of Santa Clara, Calif., and a Model number MAX207CAG manufactured by Maxim for the driver 220.

In the present embodiment, the nonvolatile memory 208 is flash memory, such as model number AM28FOO2T manufactured AMD. However, any other type of nonvolatile memory may be used including an electrically erasable programmable ROM (EEPROM) or even rewritable optical media. In one embodiment of the present invention, the volatile memory 206 is random access memory (RAM), such as model number M5M51008ARV static RAM manufactured by Mitsubishi. The control circuit 210 may be, for example, a model number EMP7032TC44 electronically programmable logic device manufactured by Altera.

Figure 3:
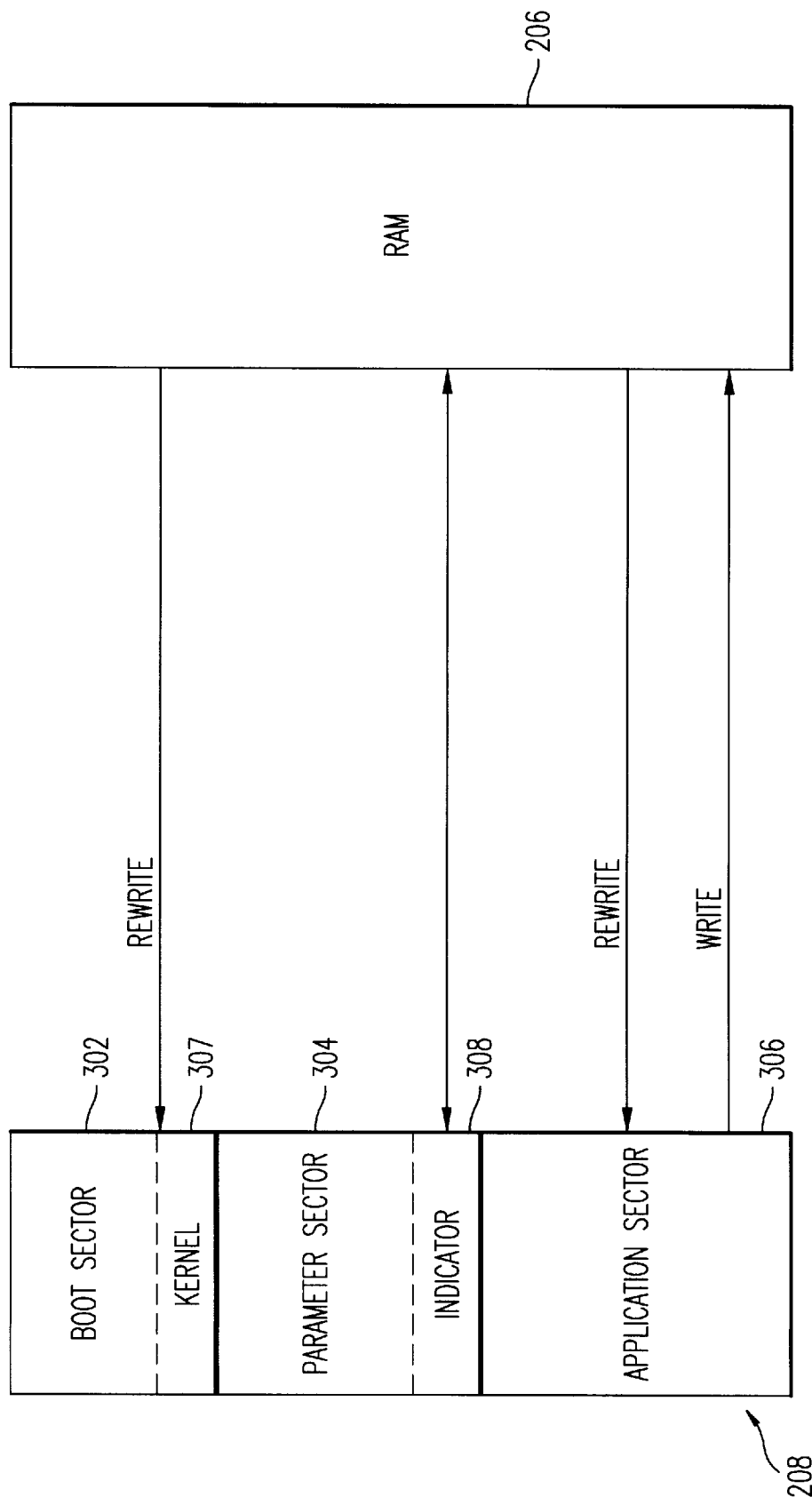
FIG. 3 is a block diagram illustrating a data flow between memories of the secure interface card of FIG. 2 in accordance with the present invention.

Referring to FIG. 3, the nonvolatile memory 208 contains a kernel program 307 (or boot program) in a boot sector 302, an indicator 308 in a parameter sector 304, and an application program in an application sector 306 for execution by the secure interface card 104. The boot program, indicator and application program may be separately reprogrammed by the computer 102, without removing the secure interface card 104 from the computer 102.

As schematically shown in FIG. 3, RAM 206 communicates with respective sectors of the nonvolatile memory 208 during the reprogramming process. At an initial power on event, a power reset event, or reapplying power event, the processor 204 begins executing the boot program 307 by addressing that portion of the boot sector 302 by way of the address bus (FIG. 2). The processor then accesses the parameter sector 304, in which data parameters are stored indicative of the operation and state of the software being executed by the secure interface card 204. As will be discussed, one of the parameters stored in the parameter sector 304 is the indicator 308, the value of which is interpreted by the processor as indicative of whether the application program contained in the application sector 306 is valid or not. The application program is executed by the processor 204 after the processor boots up properly and determines that the application program contains valid data. In one embodiment of the present invention, the application program serves as a protocol conversion mechanism that converts data passed between the computer 102 and the telephone 106. However, the application program may perform other functions in lieu of, or in addition to, the protocol conversion operation.

The indicator 308 has a specific hexadecimal value (e.g., OXFF) contained therein when corrupt or invalid data is present and another hexadecimal value (e.g., OXO1) contained therein when valid data is present. Alternatively, additional indication values may be used as well, providing additional information (such as file size, error correction information, etc.) that may be used to determine whether the application program contains one or more errors.

Prior to reprogramming the application sector 306 (or, alternatively, the boot sector 302) of the nonvolatile memory 208, the indicator 308 is set to indicate invalid data. This allows the boot program 307 to detect at a subsequent power up event whether or not the programming of the nonvolatile memory 208 was properly completed. When successfully completed, the indicator 308 is set to indicate valid data is present, as will be explained in more detail with respect to FIG. 4.

Figure 4:
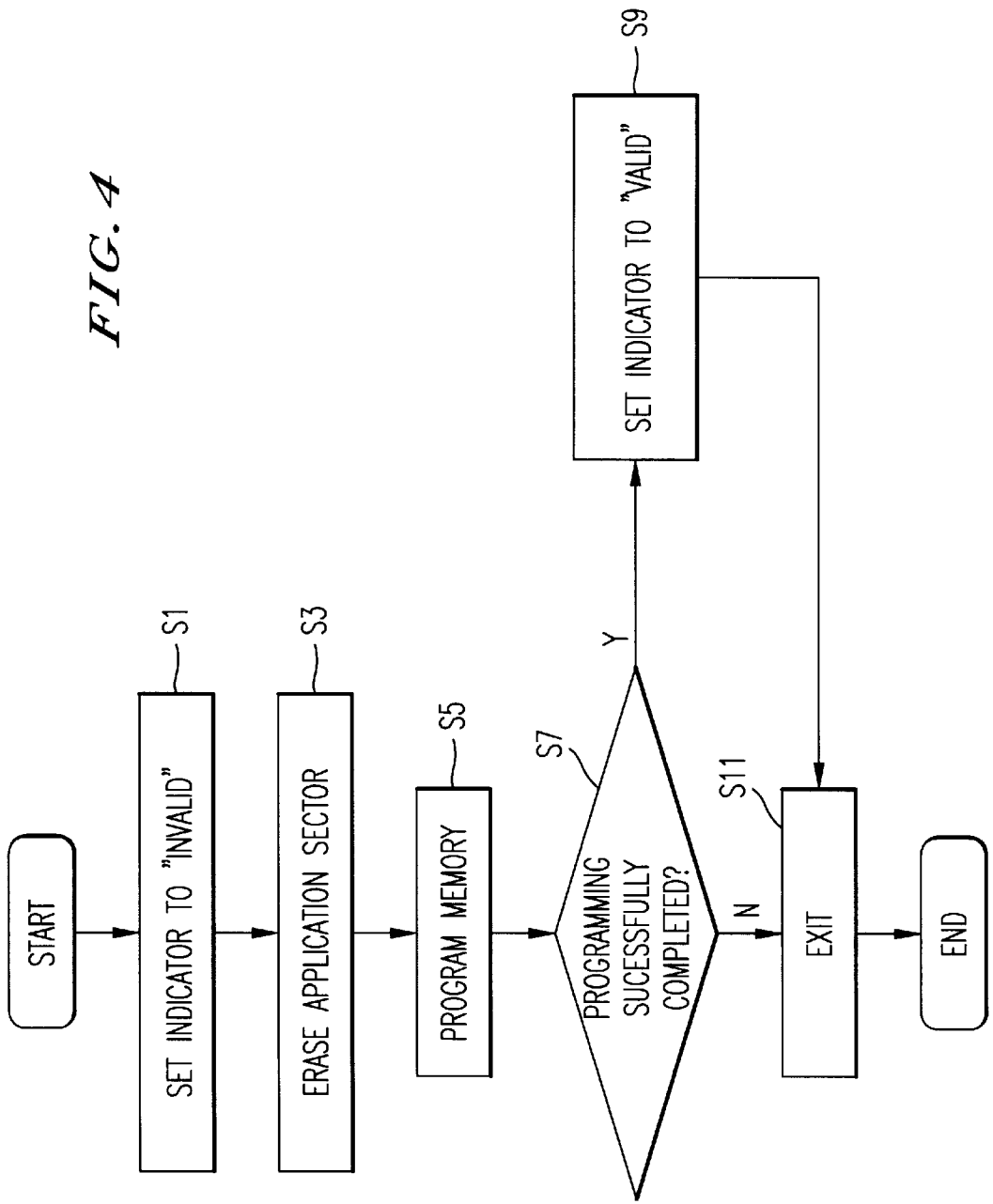
FIG. 4 is a flowchart illustrating a memory programming operation for programming the nonvolatile memory of the secure interface card of Figure.

FIG. 4 is a flowchart of a process flow for programming the application sector 306 (FIG. 3) with a new application program. A similar process flow may be used for programming other sectors of the nonvolatile memory 208. The process begins in step S1 where the processor 204 causes an "invalid" indicator value to be written to the indicator portion 308 of the nonvolatile memory 208. The indicator value may be written directly from the processor 204, or under control of the processor 204 by way of the RAM 206 (FIG. 3). After step S1, the application sector 306 is erased in step S3. Alternatively, before erasing the application sector, an old application contained in the application sector 306 is written to the RAM 206 so that it may be reused later, if necessary, and then the application sector 306 is erased. After step S3, the process proceeds to step S5, where the processor 204 directs an application program stored in RAM 206, for example, or from an external source, not shown, to be written to the application sector 306. Thus, at the conclusion of step S5, the old program contained in the application sector 306 has been erased and replaced with a new application program.

After completing step S5, the process proceeds to step S7 where an inquiry is made regarding whether the programming operation has been successfully completed. By performing step S7, information is gained regarding whether the application program contained in the application sector 306 is valid or not. For example, if as a result of a power outage, or other interruption during program, it is possible that the application software is not completely written to the application sector 306 or otherwise contains erroneous data, and thus does not contain the full complement (or accurate complement) of computer code intended to be loaded into the application sector 306. Thus, if the processor 204 detects that the programming operation did not finish, then it is known that the application program is invalid. The processor may also check file size, error correction information (such as cyclical redundancy check information), etc. as alternative or complementary ways of determining whether the application program is properly stored in the memory. Accordingly, if the response to the inquiry in step S7 is negative, the process proceeds to step S11 where the programming operation exits, without changing the value of the indicator 308. However, if the response to the inquiry in step S7 is affirmative, the process proceeds to step S9 where the indicator value is changed to reflect a "valid" indication. As a consequence, before executing the application program, the processor 204 is able to check the indicator value and determine whether or not the application program contains valid data. Subsequently the process exits the programming operation in step S9, and the process ends.

Figure 5:
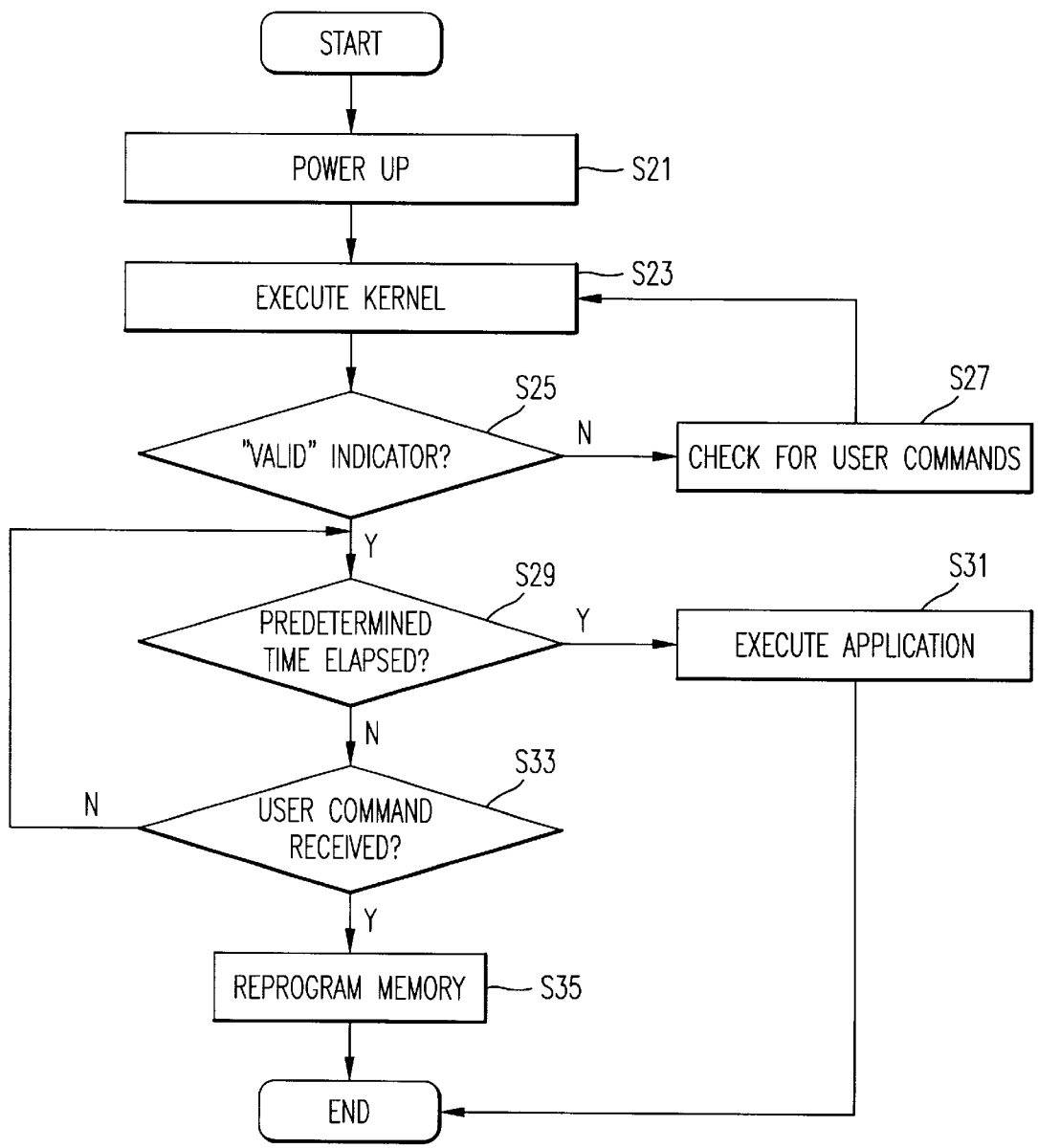
FIG. 5 is a flowchart illustrating an operation of the secure interface card of FIG. 2.

FIG. 5 is a flowchart of a process flow indicating how the value in the indicator portion 308 of the parameter sector 304 affects process flow and whether the application program is executed or process flow control is retained in the boot program. The process begins in step S21 which defines a power-up condition, a condition that may occur by turning the system on, performing hardware and software reset conditions, etc. After step S21, the process proceeds to step S23, where the processor 204 executes the boot program (or kernel) in the kernel location 307 of the boot sector 302. Executing the boot program configures the system, without relinquishing control of the process flow to the application program. Of course, if the system boots up properly, the process flow normally transfers to the application program, unless the process flow is interrupted, perhaps to correct an error in the application program (as will be discussed).

After step S23, the process proceeds to step S25, where an inquiry is made regarding whether the value contained in the indicator portion 308 represents valid information. If the response to the inquiry in step S25 is negative (indicating that invalid data exists in the application sector 306), the process proceeds to step S27. In step S27, control of the processor 204 is retained by the boot program without relinquishing control to the application program because it has been determined that the application program contains corrupted data. Process flow control remains with the boot program until a user-issued command is sent to the processor 204 in an attempt to take corrective action, such as reprogramming the application sector 306. To this end, the boot program may prompt the user with a message displayed on the computer's display informing the user that the application program was detected as containing corrupt data and the user must take corrective action such as by rewriting the application program to the application sector 306. At the completion of step S27, process control returns to the boot program in step S23, where user commands may redirect the process flow, such as by implementing the process flow shown in FIG. 4 and then exiting directly (not shown in FIG. 5).

If the response to the inquiry in step S25 is affirmative, the process proceeds to step S29 where a second inquiry is made regarding whether a predetermined amount of time has elapsed. If the response to the inquiry of step S29 is negative, the process proceeds to a third inquiry in step S33, where an inquiry is made regarding whether user commands have been received within the predetermined time period (e.g., 5 seconds). If the response to the inquiry in step S33 is affirmative, the memory is reprogrammed in step S35 and the process ends. However, if the response to the inquiry in step S33 is negative, the process returns to step S29, until the predetermined time elapses.

Waiting the predetermined amount of time affords the operator a window of opportunity in which to take corrective action before the process flow transitions to the application program. This scenario exits when the indicator suggests the application program is valid but the user nonetheless wishes to take corrective action, such as to correct a logical error in the application software. Thus, waiting for the predetermined amount of time before executing the application software serves as a failsafe mechanism in the event the user is not pleased with the application software configuration. If an affirmative response is received to the inquiry in step S29, the process proceeds to step S3 1 where the new application software contained in the application sector 306 is executed, and then the process ends.

The processes set forth in the present description may be implemented using a conventional general purpose microprocessor programmed according to the teachings of the present specification, as will be appreciated to those skilled in the relevant art(s). Appropriate software coding can readily be prepared by skilled programmers based on the teachings of the present disclosure, as will also be apparent to those skilled in the relevant art(s).

The present invention thus also includes a computer-based product which may be hosted on a storage medium and include instructions which can be used to program a computer to perform a process in accordance with the present invention. The storage medium can include, but is not limited to, any type of disk including floppy disk, optical disk, CD-ROMS, and magneto-optical disks, ROMS, RAMs, EPROMs, EEPROMs, flash memory, magnetic or optical cards, or any type of media suitable for storing electronic instructions.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A method for rewriting a nonvolatile rewritable memory, comprising the steps of:
   identifying an application program to be stored in said nonvolatile rewritable memory;
   writing an indicator value to a first segment of said nonvolatile memory rewritable memory, which comprises a flash memory, said indicator value indicating that data contained in an application portion of said nonvolatile memory contains invalid data;
   transferring an old application program from said application portion to an auxiliary memory;
   erasing said application portion of the second segment of said nonvolatile rewritable memory;
   transferring the application program to the second segment of said nonvolatile rewritable memory; and
   determining whether the application program was completely written to the nonvolatile rewritable memory; and
   changing the indicator value in the nonvolatile rewritable memory to another value if in the determining step it is determined the application program is completely written to nonvolatile rewritable memory.

2. The method of claim 1, wherein:
   the erasing step comprises erasing at least one of an old application program and a boot program; and
   said transferring step comprises transferring at least one of the application program and a new boot program.

3. The method of claim 1, further comprising the steps of:
   determining whether said another value is present so as to indicate that said application program was completely written to the nonvolatile rewritable memory and thus constituting valid data; and
   executing said application program if it is determined that said application portion contains valid data, but not executing said application program if it is determined that said application portion does not contain valid data.

4. The method of claim 3, further comprising the steps of:
   waiting for a predetermined amount of time before performing said executing step;
   determining whether a command signal is issued while waiting for said predetermined amount of time; and
   retaining program flow control by not executing said application program if it is determined that the command signal was issued.

5. A processor-based system comprising:
   a nonvolatile rewritable memory having a first segment configured to store an application program therein and a second segment configured to store an indicator value that indicates whether said application program was completely and correctly programmed in said first segment thus constituting valid data; and
   a computer program product including,
      a computer storage medium and a computer program code mechanism embedded in the computer storage medium for rewriting a nonvolatile memory and preventing non-recoverable errors from perpetually locking-up the system when an error is present in the application program, said computer program code having,
      a writing mechanism configured to write the indicator value to the second segment, said indicator value indicating that data contained in the first segment is not a correctly programmed version of the application program thus constituting invalid data,
      an erasure mechanism configured to erase said first segment,
      a transfer mechanism configured to transfer the application program to the first segment,
      a determination mechanism configured to determine whether the application program was written completely to the nonvolatile rewritable memory, and
      an indicator change mechanism configured to change the indicator value to another value if the determination mechanism determines that the application program is completely written to nonvolatile rewritable memory.

6. The system of claim 5, wherein:
   said nonvolatile memory comprises a flash memory.

7. The system of claim 5, wherein said computer program code further comprises:

another determination mechanism configured to determine whether said indicator value is indicative of valid data being contained in said first segment; and a delay mechanism configured to delay a predetermined amount of time before said execution mechanism executes said application program;

an execution mechanism configured to execute said application program if said another determination mechanism determines that said first segment contains valid data, but not executing said application program if said first segment does not contain valid data;

a third determination mechanism configured to determine whether a command signal is issued during said predetermined amount of time; and a retention mechanism configured to retain a program flow control by not executing said application program if it is determined that the command signal was issued.

8. The system of claim 7, further comprising:

a display on which a message is displayed indicating that a determination was made that said first segment does not contain valid data when said another determination mechanism determines that said first segment does not contain valid data.

9. A system for rewriting a nonvolatile rewritable memory, comprising:

means for identifying an application program to be stored in said nonvolatile rewritable memory;

means for writing an indicator value to a predetermined portion of said nonvolatile rewritable memory, said indicator value indicating that data contained in an application portion of said nonvolatile memory is not a correctly programmed version of the application program thus constituting invalid data;

means for erasing said application portion of the nonvolatile rewritable memory;

means for transferring the application program to the nonvolatile rewritable memory;

means for determining whether the application program was completely written to the nonvolatile rewritable memory; and means for changing the indicator value in the nonvolatile rewritable memory to another value if the means for determining determines the new program is completely and correctly written to nonvolatile rewritable memory.

* * * * *